United States Patent [19]
Park

[11] Patent Number: 5,263,182
[45] Date of Patent: Nov. 16, 1993

[54] LOW-NOISE BLOCK CONVERTER FOR A SATELLITE BROADCASTING SYSTEM

[75] Inventor: Hyun-Chul Park, Ansan, Rep. of Korea

[73] Assignee: SamSung Electronics Co., Ltd., Paldal-Kuwon, Rep. of Korea

[21] Appl. No.: 301,456

[22] Filed: Jan. 24, 1989

[30] Foreign Application Priority Data

May 18, 1988 [KR] Rep. of Korea .................. 1988-5804

[51] Int. Cl.$^5$ ............................................. H04B 1/16
[52] U.S. Cl. .................................. 455/188.1; 455/3.2; 455/209; 455/258
[58] Field of Search ...................... 455/209, 3, 12, 4-6, 455/183, 189, 188, 190, 255-258, 313-316, 318, 131, 296, 3.2, 3.1, 3.3, 4.1, 4.2, 5.1, 6.2, 183.1, 189.1, 188.1, 190.1; 358/86, 191.1

[56] References Cited

U.S. PATENT DOCUMENTS

| | | |
|---|---|---|
| 4,322,856 | 3/1982 | Ohta et al. ............................ 455/189 |
| 4,384,367 | 5/1983 | King et al. . |
| 4,408,348 | 10/1983 | Theriault . |
| 4,555,807 | 11/1985 | Bryant . |
| 4,592,093 | 5/1986 | Ouchi et al. ........................... 455/3.2 |
| 4,608,710 | 8/1986 | Sugiura ................................ 455/183 |
| 4,661,997 | 4/1987 | Roberts et al. . |
| 4,783,843 | 11/1988 | Leff et al. . |
| 5,027,430 | 6/1991 | Yamauchi et al. .................. 455/296 |

Primary Examiner—Reinhard J. Eisenzopf
Assistant Examiner—Edward Urban
Attorney, Agent, or Firm—Robert E. Bushnell

[57] ABSTRACT

A system for receiving the satellite broadcasting signal which amplifies all signals within 10.95-12.5 GHz by use of a single low-noise wide-band amplifier, selects one of two local oscillators having frequencies of 10 GHz and 10.75 GHz according to a FSS/BSS Fixed Satellite Service/Broadcasting Satellite Service (FSS/BSS) selection control signal by use of the two local oscillators, and amplifies the signals of 0.95-1.75 GHz band in an IF amplifier, whereby all the satellite broadcasting signals of the FSS/BSS bands can be received by using a single low-noise block converter instead of using double low-noise block converters. The system includes a low-noise block converter 102 for selecting one of two local oscillators according to a FSS/BSS selection control signal, so that either one of the satellite broadcasting signals of FSS/BSS bands can be received through the antenna; and a satellite broadcasting receiver 30 coupled between the block converter and the television receiver, for generating the FSS/BSS selection control signal selected by an user, receiving a corresponding intermediate-frequency (IF) signal outputted from the block converter, and then converting the IF signal of the satellite into a radio-frequency (RF) signal for television through the detection of the IF signal received, so that the converted signal is thereby outputted to the television receiver.

13 Claims, 4 Drawing Sheets

LOW-NOISE BLOCK CONVERTER FOR A SATELLITE BROADCASTING SYSTEM

BACKGROUND OF THE INVENTION

The present invention relates to a low-noise block converter for use in a receiver for a satellite broadcasting system, and more particularly, to the low-noise block converter being capable of receiving two-band satellite broadcasting signals, especially for use in Europe.

Conventionally, a known satellite broadcasting system in Europe is constituted as shown in FIG. 1, in which it can be seen to be divided into FSS (Fixed Satellite Service; 10.95–11.7 GHz) and BSS (Broadcasting Satellite Service; 11.7–12.5 GHz). Accordingly, in order to receive a broadcasting signal from the satellite, BSS/FSS LNBs (low-noise block converter) 10,20 have been required to convert the super high frequency signal into IF signal, wherein, in order to select the signal of the corresponding band, a voltage of logic low/high (i.e., zero/12 Volts) has been applied at a FSS/BSS selection terminal SW1 of a satellite broadcasting receiver 30, so that either one of the BSS low-noise block converter 10 or the FSS low-noise block converter 20 is thereby selected to receive the signal.

FIGS. 2(A) and 2(B) each show in more detail the FSS low-noise block converter 20 and the BDD low-noise block converter 10. In the FSS low-noise block converter shown in FIG. 2(A), a low noise amplifier 21 amplifies a super high frequency signal of 10.95–11.7 GHz band inputted at a radio-frequency (RF) signal input terminal RFI1. The amplified signal is passed through a predetermined band of a band pass filter 22 so that in a mixer 23 it is mixed with an oscillating signal of 10 GHz from a local oscillator 24 and thereafter the mixed signal is amplified by an intermediate (IF) amplifier 25 to obtain at an IF output terminal IFO1 a signal of 0.95–1.7 GHz, which is used for the purpose of transmitting the picture image to a cable TV broadcasting station or the like. In the BSS low-noise block converter shown in FIG. 2(B), a super high frequency amplifier 31 amplifies a super high frequency signal of 11.7–12.5 GHz band inputted at a RF signal input terminal RFI2. The amplified signal is passed through the corresponding band of a band pass filter 32 and thereafter, in a mixer 33, is mixed with an oscillating signal of 10.75 GHz from a local oscillator 34 so that a signal of 0.95–1.75 GHz is outputted through a IF amplifier 35 to a IF output terminal IFO2, which is used for the purpose of transmitting the direct satellite broadcasting service to each home.

Accordingly, in order to receive the satellite broadcasting signals of two bands in the known system, each FSS and BSS low-noise block converters should be constituted separately, and in the satellite broadcasting receiver 30 the low/high voltages should be applied to a selection terminal SW1 for selecting one of the FSS and BSS low-noise block converters 10 and 20 so that the satellite broadcasting received signal of the corresponding band is selected. Therefore, the conventional system has a problem that its system construction such as the cable connection is complicated due to the use of a plurality of low-noise block converters.

SUMMARY OF THE INVENTION

It is accordingly an object of the present invention to provide a circuit for receiving the satellite broadcasting signal which amplifies all signals within 10.95–12.5 GHz by use of a single low-noise wide-band amplifier, selects one of the two local oscillators having frequencies of 10 GHz and 10.75 GHz according to a FSS/BSS selection control signal by use of the two local oscillators, and amplifies the signals of 0.95–1.75 GHz band by an IF amplifier, whereby all the satellite broadcasting signals of the FSS/BSS bands can be received by using a single low-noise block converter instead of using double low-noise block converters.

The foregoing other objects and of the invention will be better understood from the following more detailed description and appended claims.

DESCRIPTION OF THE PREFERRED EMBODIMENTS

The present invention will now be described hereinafter with reference to the drawings.

Figure 1:
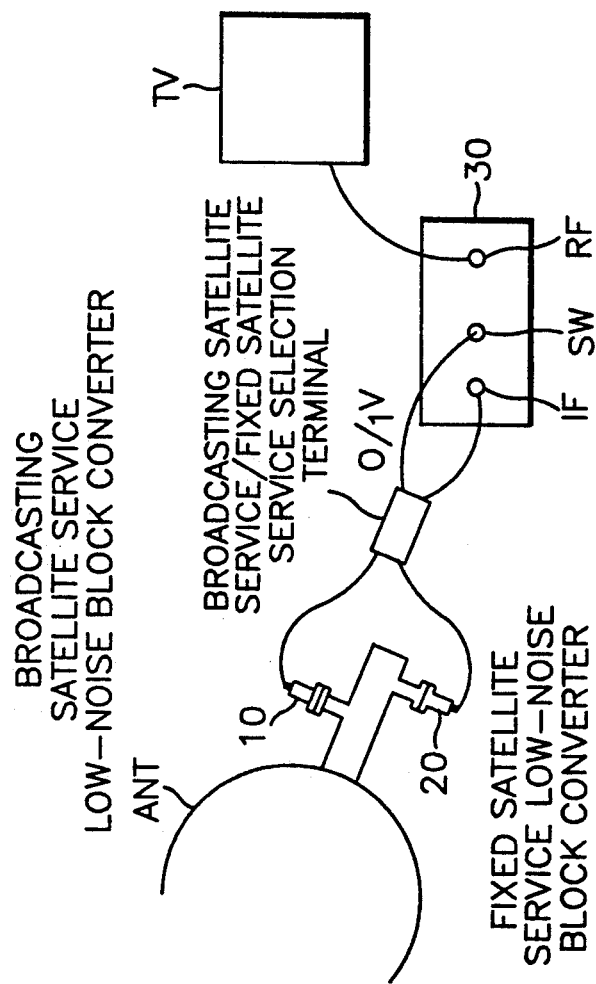
FIG. 1 is a diagram showing schematically the construction of a general satellite broadcasting receiving system.
Figure 2A:
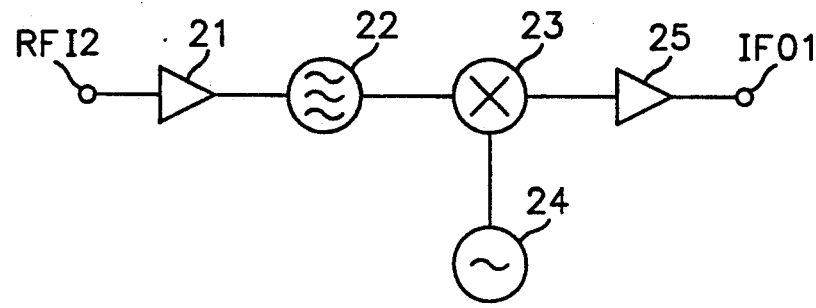
FIGS. 2(A) and 2(B) are a block diagram showing a conventional satellite broadcasting receiver, wherein 2(A) represents BSS a low-noise block converter and 2(B) represents a FSS low-noise block converter.
Figure 2B:
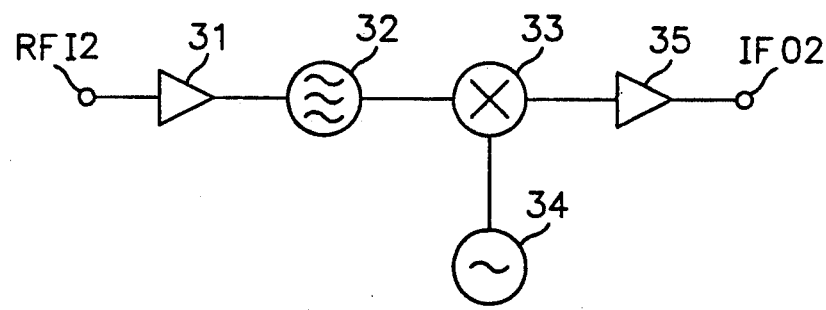
Figure 3:
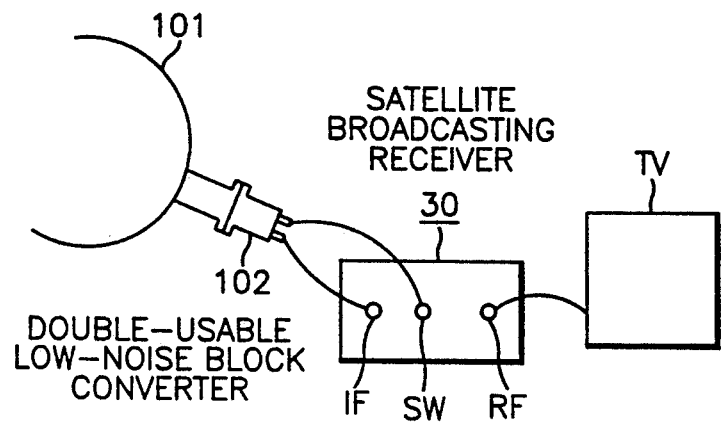
FIG. 3 is a diagram showing schematically the construction of a satellite broadcasting receiving system according to the present invention.

FIG. 3 is a diagram showing schematically the construction of a satellite broadcasting receiving system according to the present invention, which includes an antenna 101 for receiving the signal transmitted from the satellite, a double-usable low-noise block converter 102 for selecting one of two local oscillators according to a FSS/BSS selecting signal so that both of the satellite broadcasting signals of FSS/BSS bands can be received from the antenna 101, and a satellite broadcasting receiver 30 which generates the FSS/BSS selection control signal designated by an user, receives the corresponding IF signal outputted from the double-usable low-noise block converter 102, and detects the received IF signal and thereafter converts the satellite IF signal into the RF signal so that the converted signal is outputted to a television monitor.

Figure 4:
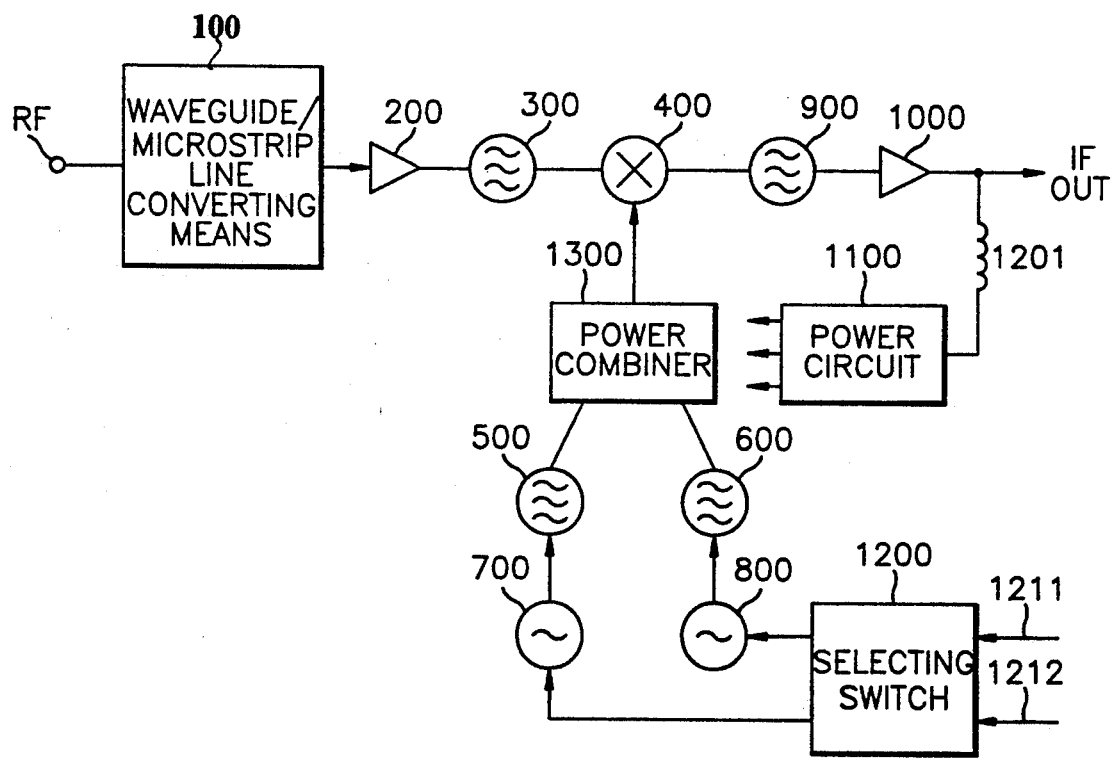
FIG. 4 is a block diagram of a low-noise block converter according to the present invention.

FIG. 4 is a detailed block diagram showing the double-usable low noise block converter 102 of FIG. 3 according to the present invention, wherein it contains a waveguide/microstrip line converting device 100 for detecting the super-high-frequency (SHF) signal received from the antenna 101, by a probe (not shown) through the waveguide; a SHF wide band amplifier 200 for amplifying the SHF signals provided through the waveguide/microstrip line converting device 100 to satisfy, the SHF wide band amplifier having low-noise characteristics within a bandwidth of 1.55 GHz at a center frequency of 11.725 GHz; a first band-pass filter 300 passing only signals within 10.95–12.5 GHz band so as to reject any signals other than a desired SHF signal, from the output of the SHF wide band amplifier 200; a selecting switch 1200 for receiving the input of a predetermined bias voltage from power supply 1100 at a bias input node 1211 to switch the bias voltage by the FSS/BSS selection control signal inputted through a selection signal input terminal 1212; first and second dielectric resonance oscillating devices 700 and 800 for generating a predetermined local oscillation signal according to the bias voltage outputted by the selecting switch 1200; a second band-pass filter 500 for filtering the oscillating signal of the first dielectric resonance oscillating device 700 in 10 GHz band; a third band-pass filter 600 for filtering the oscillating signal of the second dielectric resonance oscillating device 800 in 10.75 GHz band; a power combiner 1300 for outputting one of two oscillating signals generated through the second and third band-pass filters 500 and 600, respectively; a mixer 400 for mixing the signal of the power combiner 1300 with the signal of the first band-pass filter 300 to thereby output the difference between the applied SHF signal and the oscillation signal; a fourth band-pass filter 900 for filtering the output of the mixer 400 in 0.95-1.75 GHz band; an IF amplifier 1000 for amplifying the output of the fourth band-pass filter 900 into the signal of the IF frequency band; and a power circuit 1100 to generate the bias power supply signals for each means (namely the wide band amplifier 200 (VG1, VG2, VD1, VD2), mixer 400 (VG3, VD3), first dielectric oscillating means 700 (VG4) and second dielectric oscillating means 800 (VG5)).

A preferred embodiment of the present invention will be explained according to the configuration of FIG. 4. The RF input signal received by the antenna 101 is detected by the probe through the waveguide and is inputted to the SHF wide band amplifier 200 by the waveguide/microstrip line converting device 100. The SHF amplifier 200 has a bandwidth of 1.55 GHz at center frequency of 11.725 GHz and should have the low-noise characteristics. In order to remove the signals other than the desired RF signal, the first band-pass filter 300 using the microstrip line is employed, and the output signals filtered by it are inputted to the mixer 400. On the other hand, in the receiver 30, the bias voltage is supplied at one of two cables, while zero volt or a logic high signal (i.e. 12 Volts, hereinafter referred to as "+V") according to selection of the FSS/BSS is supplied at the other cable. The bias voltage is supplied as constant voltage through the power circuit 1100 and 0 or +V volt is inputted to the selecting switch so that, in case of 0 volt the bias voltage is supplied for only the first dielectric resonance oscillating device 700 and in case of +V volt the bias voltage is supplied for only the second resonance oscillating device 800. The first and second dielectric resonance oscillating device 700 and 800 achieve the stabilization of the frequency by use of the dielectric resonator, and the second and third band-pass filters 500 and 600 serve to pass only the oscillation signals of the first and second dielectric resonance oscillating device 700 and 800 connected thereto so as to thereby allow to remove the other oscillating signal band in the power combiner 1300. The power combiner 1300 serves to apply one of the two oscillating signals to the mixer 400, and the difference between the RF signal applied from the first band-pass filter 300 and the oscillating signal outputted from the power combiner 1300 is obtained as the IF signal. Also, the image signal is removed in the fourth band-pass filter 900 to be amplified through the IF amplifier 1000. Accordingly, the IF amplifier 1000 can select two signals of 0.95-1.75 GHz band.

Figure 5:
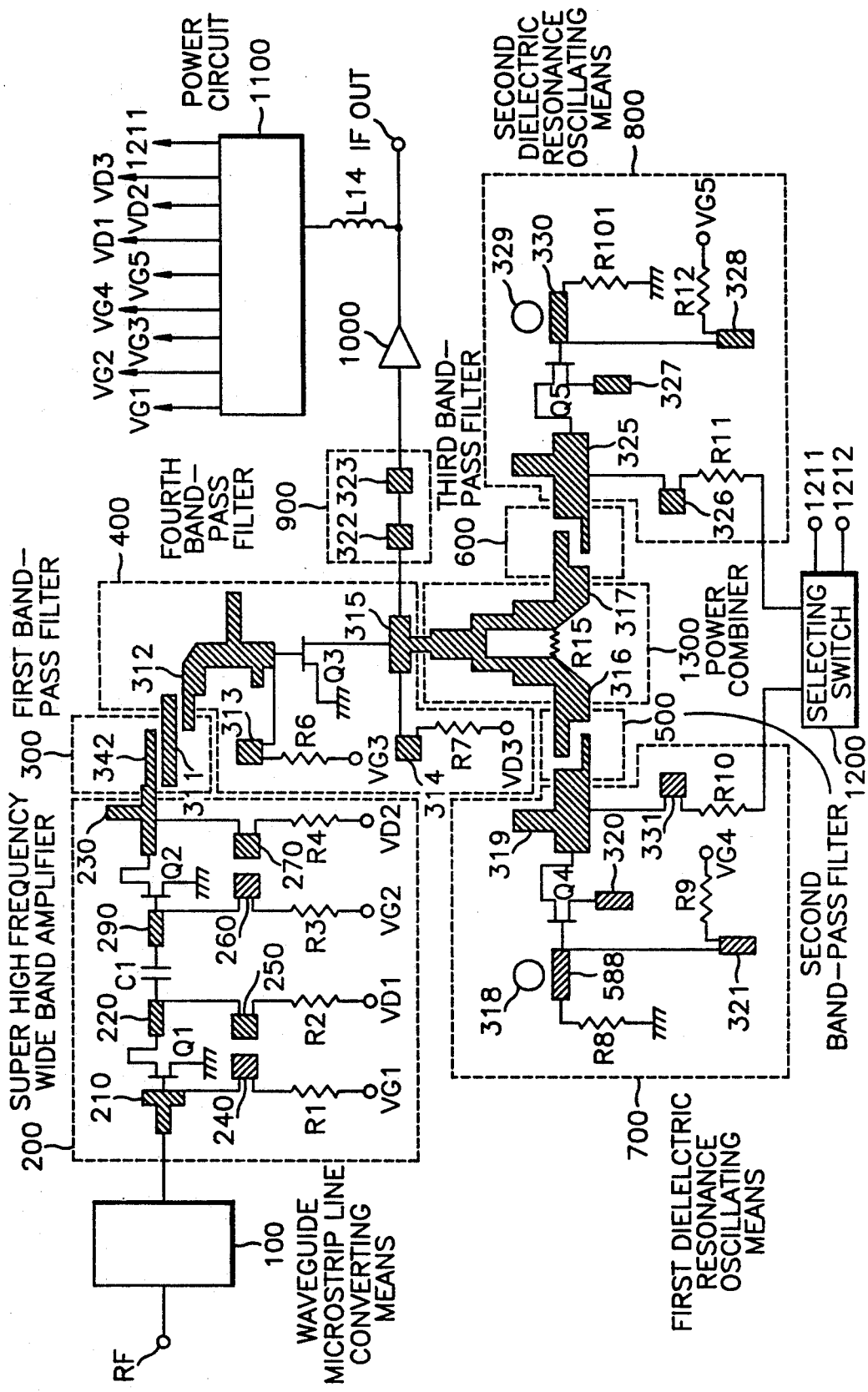
FIG. 5 is a detailed circuit diagram of the low-noise block converter according to the present invention.

FIG. 5 is a detailed circuit diagram specifically showing the preferred embodiment of FIG. 4 according to the present invention. In FIG. 5, the SHF wide-band amplifier 200 includes a capacitor C1, GaAs FETs Q1 and Q2, impedance matching stubs 210,220,230 and 290, bias chokes 240,250,260 and 270, and resistors R1-R4. And the first band-pass filter 300 includes an extended stub 342 extended from the impedance matching stub 230 of the SHF wide-band amplifier 200, a stub 311 spaced out from and provided in parallel to the extended stub 342, and a stub 312 spaced out from and provided in parallel to the stub 311. Also, the mixer 400 includes a part of the impedance matching stub 312 extended from the first band-pass filter 300, a stub 313, a GaAs FET Q3, and a resistor R6. The first dielectric resonance osillating device 700 includes stubs 319-321,331 and 588, resistors R8-R10, a GaAs FET Q4, and a dielectric resonance oscillator 318. The second dielectric resonance oscillating device 800 include stubs 325-328 and 330, a GaAs FET Q5, resistors R11-R12 and R101, and a dielectric resonance oscillator 329. In addition, the power combiner 1300 includes stubs 316 and 317, and a resistor R15. The second band-pass filter 500 includes a part of the extended stub 319 from the first dielectric resonance oscillating device 700 and another part of the extended stub 316 from the power combiner 1300, being spaced out from each other, and also the third band-pass filter 600 includes a part of the extended stub 325 from the second dielectric resonance oscillating device 800 and another part of the extended stub 317 from the power combiner 1300, being spaced out from each other. Furthermore, the fourth band-pass filter 900 includes two stubs 322 and 323. Referring to FIG. 5, the other reference numerals 100, 1200, 1100, 1000 and 1201 which are not described above, show the same elements as those in FIG. 4, wherein the gate bias voltages VG1-VG5 are approximately −0.5 Volt and the drain bias voltages VD1-VD3 are approximately 2.5-3 Volts all bias voltages supplied the power supply 1100.

The operation of the embodiment of the present invention will be explained in detail according to the construction, hereinafter. The signals of 10.95-11.7 GHz inputted through the antenna are transmitted through the waveguide/microstrip line converting device 100 to the SHF wide-band amplifier 200. The SHF wide-band amplifier 200 is constituted by two stages of GaAs FETs Q1 and Q2, wherein the reference numerals 210, 220 and 230 are the impedance matching stubs for GaAs FETs Q1 and Q2, and the reference numerals 240,250,260 and 270 are the bias chokes and are amplified in the wide band, and the amplified signals are inputted through the first band-pass filter 300 to the mixer 400. For the mixer 400 the GaAs FET Q3 is used. According to the signal for selecting the band received in the receiver, one of the first and second dielectric resonance oscillating devices 700 and 800 are selected. The first and second dielectric resonance oscillating devices 700 and 800 use GaAs FETs Q4 and Q5 and the first and second dielectric resonance oscillators 318 and 329 to thereby have the high stability. Also the second and third band-pass filters 500 and 600 passing only the oscillation frequency signal deliver the signal reversed by the coupled-type microstrip line, through the power combiner 1300 to the mixer 400. The mixer 400 mixes the RF signal with the oscillation signal to output the IF signal corresponding to the difference therebetween. The IF signal is amplified so that the image signal can be removed in the fourth band-pass filter 900, and thereafter is inputted through the cable to the receiver.

While it has been shown and described what is considered to preferred embodiments of the present invention, it will be apparent to those skilled in the art that various changes and modifications may be made therein without departing from the spirit of the invention as defined in the appended claims and that it may be possible to reveive the satellite broadcasting service of U.S.A. by use of the low-noise block converter according to the present invention. Furthermore, the satellite broadcasting signals of 12 GHz band at various areas can be covered if one local oscillating signal is added thereto or the VCO (voltage controlled oscillator) is constituted by using a vibrator.

As apparent from the aforementioned description, the present invention may achieve the efficient reception for a plurality of satellite broadcasting services in Europe, specifically. Therefore, the advantages can be expected, such as the simplization of the satellite broadcasting system, the reduction of cost, and the efficient reception for the various satellite broadcasting signals of 12 GHz band only by adding a single oscillator thereto.

What is claimed is:

1. A receiver system for use in a satellite broadcasting system having a television receiver and an antenna for receiving satellite broadcasting signals of first and second bands transmitted from a satellite, said receiver system comprising:

a low-noise block converter for selecting one of two local oscillators according to a first/second selection control signal, so that either one of the satellite broadcasting signals of said first and second bands can be received through said antenna; and a satellite broadcasting receiver, adapted to be coupled between said low-noise block converter and said television receiver, for generating said first/second selection control signal, receiving a corresponding intermediate frequency signal from said low-noise block converter, and converting said intermediate frequency signal into a radio-frequency signal for television through detection of the received intermediate frequency signal, said radio-frequency signal being provided to the television receiver; wherein said low-noise block converter comprises:

waveguide/microstrip-line converting means for detecting a super-high frequency signal received from the antenna, by a probe through a waveguide;

a super-high frequency wide-band amplifier, coupled to said waveguide/microstrip line converting means, for amplifying intermediate frequency signals of 10.95–11.7 GHz and 11.7–12.5 GHz received from said waveguide/microstrip line converting means, to satisfy low-noise characteristics within a bandwidth of 1.55 GHz at a center frequency of 11.725 GHz;

a first band-pass filter coupled to said super-high frequency wide-band amplifier, for passing signals within 10.95–12.5 GHz band to remove signals other than the desired frequency signal from the amplified intermediate frequency signals from said super-high frequency wide-band amplifier;

a selecting switch for receiving a predetermined bias voltage from a bias input node and selecting said bias voltage for output in response to said first/second selection control signal received through a selection signal input terminal;

first and second dielectric resonance oscillating means each coupled to said selecting switch, for generating predetermined first and second local oscillation signals, respectively, according to the bias voltage from said selecting switch;

a second band-pass filter coupled to said first dielectric resonance oscillating means, for filtering a first oscillating signal from said first dielectric resonance oscillating means, in a 10 GHz frequency band;

a third band-pass filter coupled to said second dielectric resonance oscillating means, for filtering a second oscillating signal from said second dielectric resonance oscillating means, in a 10.75 GHz frequency band;

a power combiner coupled to the second and third band-pass filters, for outputting one of the two oscillating signals received from said second and third band-pass filters;

a mixer coupled to the first band-pass filter and the power combiner for mixing the oscillating signal output by said power combiner with the frequency signal passed by said first band-pass filter to produce a signal according to the difference between said frequency signal and said oscillating signal;

a fourth band-pass filter coupled to said mixer, for filtering the signal produced by said mixer in 0.95–1.75 GHz band; and an intermediate frequency amplifier coupled to the fourth band-pass filter, for amplifying the signal received from said fourth band-pass filter into said corresponding intermediate frequency signal of an intermediate frequency band.

2. A low noise block converter for use in a receiver system, comprising:

converting means comprising an antenna, a waveguide and a probe coupled to said waveguide for detecting first signals received by said antenna;

first amplifier means coupled to receive the first signals from said converting means for amplifying intermediate frequency signals of 10.95–11.7 GHz and 11.7–12.5 GHz of the first signals received from said converting means;

first filter coupled to receive amplified first signals from said first amplifier means, said first filter means for generating second signals by passing only signals within a 10.95–12.5 GHz band and for removing signals other than a desired radio frequency signal received from said first amplifier means;

a selecting switch;

first oscillating means coupled to said selecting switch;

second oscillating means coupled to said selecting switch;

second filter means coupled to said first oscillating means;

third filter means coupled to said second oscillating means;

a power combiner coupled to said second and third filter means;

a mixer coupled between said first filter means and said power combiner;

fourth filter means coupled to said mixer; and second amplifier means coupled to said fourth filter means.

3. A low noise block converter as claimed in claim 2, wherein said first amplifier means amplifies said intermediate frequency signals to satisfy low-frequency characteristics within a band of 1.55 Ghz at a center frequency 11.725 Ghz.

4. A low noise block converter as claimed in claim 3, wherein said selecting switch receives a bias voltage at a bias input node for switching between said first and second oscillating means based on a received Fixed Satellite Service/Broadcasting Satellite Service selection control signal.

5. A low noise block converter as claimed in claim 4, wherein said first oscillating means generates respective first predetermined local oscillation signals according to a first bias voltage received from said selecting switch.

6. A low noise block converter as claimed in claim 5, wherein said second oscillating means generates respective second predetermined local oscillation signals according to a second bias voltage received from said selecting switch.

7. A low noise block converter as claimed in claim 6, wherein said second filter means filters the first oscillating signals of said first oscillating means, in a 10 GHz frequency band.

8. A low noise block converter as claimed in claim 7, wherein said third filter means filters the second oscillating signals of said second oscillating means, in a 10.75 GHz frequency band.

9. A low noise block converter as claimed in claim 8, wherein said power combiner provides the first or second oscillating signals received from said second and third filter means based on the bias voltage.

10. A low noise block converter as claimed in claim 9, wherein said mixer the signal provided by said power combiner with the signal from said first filter means to generate a signal based on the difference therebetween.

11. A low noise block converter as claimed in claim 10, wherein said fourth filter means filters the signal generated by said mixer in a 0.95–1.75 GHz band.

12. A low noise block converter as claimed in claim 11, wherein said second amplifier means amplifies the output of said fourth filter means into a signal of intermediate frequency band.

13. A low noise block converter for use in a receiver system, comprising:
an antenna for receiving a first signal;
converting means to convert the first signal into an intermediate frequency signal, comprising:
first amplifier means for amplifying intermediate frequency signals of said first signal received from said converting means;
first filter means for generating a second signal by removing signals other than a desired frequency signal from said amplified intermediate frequency signals received from said first amplifier means;
a selecting switch coupled to receive a bias voltage;
first oscillating means, coupled to said selecting switch, for generating first local oscillation signals if the bias voltage applied to said selecting switch is of a first voltage level;
second oscillating means, coupled to said selecting switch, for generating second local oscillation signals if the bias voltage applied to said selecting switch is of a second voltage level;
second filter means for filtering the first local oscillation signals of said first oscillating means;
third filter means for filtering the second local oscillation signals of said second oscillating means;
a power combiner for delivering one of the first or second local oscillating signals, received from said second and third filter means on the basis of bias voltage, to a mixer;
said mixer, being coupled between said first filter means and said power combiner, for mixing one of said first local oscillating signal and said second local oscillating signal delivered by said power combiner with the second signal from said first filter means to generate a resulting signal based on the difference between the second signal and said one of said first and second local oscillating signals delivered by said power combiner;
fourth filter means coupled to said mixer for filtering the resulting signal generated by said mixer; and
second amplifier means for amplifying the filtered resulting signal from said fourth filter to provide said intermediate frequency signal;
a receiver, coupled to receive said intermediate frequency signal from said converting means, for controlling the bias voltage applied to said selecting switch and for converting said intermediate frequency signal into a radio frequency signal; and
a television coupled to receive said radio frequency signal from said receiver.

* * * * *

UNITED STATES PATENT AND TRADEMARK OFFICE
CERTIFICATE OF CORRECTION

PATENT NO. : 5,263,182
DATED : November 16, 1993
INVENTOR(S) : Hyun- Chul Park

It is certified that error appears in the above-indentified patent and that said Letters Patent is hereby corrected as shown below:

On the title page, Item [57] Abstract
line 5, delete --FSS/BSS --.

Column 1, line 28, change "BDD to --BSS --.

Signed and Sealed this

Twenty-seventh Day of September, 1994

Attest:

BRUCE LEHMAN

Attesting Officer

Commissioner of Patents and Trademarks